United States Patent
Lee

(10) Patent No.: US 7,129,761 B2
(45) Date of Patent: *Oct. 31, 2006

(54) DIGITAL DELAY-LOCKED LOOP CIRCUITS WITH HIERARCHICAL DELAY ADJUSTMENT

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/256,215

(22) Filed: Oct. 21, 2005

(65) Prior Publication Data

US 2006/0071696 A1 Apr. 6, 2006

Related U.S. Application Data

(63) Continuation of application No. 10/722,959, filed on Nov. 26, 2003, now Pat. No. 6,982,578.

(51) Int. Cl.
*H03L 7/06* (2006.01)

(52) U.S. Cl. .................... 327/158; 327/355; 327/360; 327/361

(58) Field of Classification Search ................ None
See application file for complete search history.

(56) References Cited

U.S. PATENT DOCUMENTS

| | | | |
|---|---|---|---|
| 4,985,639 A | 1/1991 | Renfrow et al. |
| 5,355,097 A | 10/1994 | Scott et al. |
| 5,463,337 A | 10/1995 | Leonowich |
| 5,663,665 A | 9/1997 | Wang et al. |
| 5,751,665 A | 5/1998 | Tanoi |
| 5,789,927 A | 8/1998 | Belcher |
| 5,872,488 A | 2/1999 | Lai |
| 6,100,736 A | 8/2000 | Wu et al. |
| 6,194,916 B1 | 2/2001 | Nishimura et al. |
| 6,194,947 B1 | 2/2001 | Lee et al. |
| 6,295,328 B1 | 9/2001 | Kim et al. |
| 6,313,688 B1 | 11/2001 | Lee et al. |
| 6,326,826 B1 | 12/2001 | Lee et al. |
| 6,366,148 B1 | 4/2002 | Kim |
| 6,393,083 B1 | 5/2002 | Beukema |
| 6,512,408 B1 | 1/2003 | Lee et al. |
| 6,573,771 B1 | 6/2003 | Lee et al. |
| 6,618,283 B1 | 9/2003 | Lin |
| 6,621,315 B1 | 9/2003 | Heo et al. |
| 6,642,760 B1 | 11/2003 | Alon et al. |

(Continued)

OTHER PUBLICATIONS

Jong-Tae Kwak et al., "A Low Cost High Performance Register-Controlled Digital DLL for 1 Gbps x32 DDR SDRAM," The 8th Korean Conference on Semiconductors, Feb. 2001.

(Continued)

*Primary Examiner*—Timothy P. Callahan
*Assistant Examiner*—An T. Luu
(74) *Attorney, Agent, or Firm*—Fish & Neave IP Group Ropes & Gray LLP

(57) ABSTRACT

Fine tuned signal phase adjustments are provided by multiple cascaded phase mixers. Each phase mixer outputs a signal having a phase between the phases of its two input signals. With each subsequent stage of phase mixers, the signals generated by the phase mixers have a smaller phase difference, thereby providing finer delay adjustments. Multiple stages of phase mixers can be provided in digital delay-locked loop circuitry to provide additional hierarchical delay adjustment.

20 Claims, 9 Drawing Sheets

U.S. PATENT DOCUMENTS

| | | |
|---|---|---|
| 6,661,863 B1 | 12/2003 | Toosky |
| 6,762,633 B1 | 7/2004 | Lee |
| 6,768,361 B1 | 7/2004 | Kwak |
| 6,791,381 B1 | 9/2004 | Stubbs et al. |
| 6,812,753 B1 | 11/2004 | Lin |
| 6,956,418 B1 | 10/2005 | Kwak |
| 2003/0219088 A1 | 11/2003 | Kwak |
| 2005/0110539 A1 | 5/2005 | Lee |
| 2005/0127964 A1 | 6/2005 | Lee |
| 2005/0127965 A1 | 6/2005 | Lee |

OTHER PUBLICATIONS

Ramin Farjad-Rad et al., "A Low-Power Multiplying DLL for Low-Jitter Multigigahertz Clock Generation in Highly Integrated Digital Chips," IEEE Journal of Solid-State Circuits, vol. 37, No. 12, Dec. 2002, pp. 1804-1812.

DIGITAL DELAY-LOCKED LOOP CIRCUITS WITH HIERARCHICAL DELAY ADJUSTMENT

CROSS REFERENCE TO RELATED APPLICATION

This is a continuation of commonly-assigned U.S. patent application ser. No. 10/722,959, filed Nov. 26, 2003 now U.S. Pat. No. 6,982,578.

BACKGROUND OF THE INVENTION

This invention relates to digital, delay-locked loop (DLL) circuits. More particularly, this invention relates to digital delay-locked loop circuits with hierarchical delay adjustment.

Digital delay-locked loop circuits typically generate a clock signal based on a periodic reference signal (e.g., from an oscillator) that maintains a specific phase relationship with that reference signal. Digital delay-locked loop circuits are often used, for example, in high-speed clocked memories such as synchronous dynamic random access memories (SDRAMs).

A digital delay-locked loop circuit generally includes a variable delay line, a phase mixer, a phase detector, and control logic. The variable delay line includes delay units that are used to delay the reference signal by a predetermined time period (i.e., phase). The number of delay units indicate the number of possible unit delays (i.e., tUDs) that can be generated by the variable delay line. For example, a variable delay line having five delay units can delay the reference signal by one of five unit delays (e.g., tUD, 2tUD, 3tUD, 4tUD, or 5tUD). Each unit delay is typically a predetermined time increment (e.g., 100 or 200 picoseconds (ps)), which can also be measured by predetermined phase increments (e.g., 10°, 15°, or 22.5°). The variable delay line is set by the control logic such that the variable delay line receives as input a reference signal and outputs two delayed reference signals having a one unit delay difference (tUD). The two delayed reference signals are input to the phase mixer. The phase mixer is also set by the control logic such that the phase mixer generates a clock signal having a phase between the phases of the two delayed reference signals. The phase detector compares the phase of the clock signal with the phase of the reference signal to determine whether the phase of the clock signal needs to be increased or decreased to better match the desired output phase of the clock signal. The phase detector sends a signal to the control logic indicating whether the phase of the clock signal needs to be increased or decreased. Based on the output of the phase detector, the control logic sends control signals to the variable delay line and the phase mixer.

In current digital delay-locked loop circuits, two stages of delay adjustment are provided. In a first stage, the variable delay line delays the reference signal by a predetermined time period or phase. In a second stage, the phase mixer provides an additional delay that is smaller than a unit delay from the variable delay line. The minimum delay adjustment for the variable delay line and phase mixer is limited by the amount of circuitry dedicated to providing the minimum delay adjustment and by the increase in characteristic load on the variable delay line and phase mixer that results when providing additional phases with smaller delays. Consequently, known digital delay-locked loop circuits typically generate a clock signal having one of only a limited, predetermined number of phases based on the reference signal.

In view of the foregoing, it would be desirable to provide a digital delay-locked loop circuit with hierarchical delay adjustment.

SUMMARY OF THE INVENTION

It is an object of this invention to provide a digital delay-locked loop circuit with hierarchical delay adjustment.

In accordance with this invention, a digital delay-locked loop (DLL) circuit with cascading phase mixers provides fine delay adjustment of an output clock signal based on an input reference signal. The digital delay-locked loop circuit can include one or two variable delay lines that receive as input a reference signal and that output two delayed reference signals having a predetermined time delay difference (e.g., a one unit delay (tUD)).

The two delayed reference signals are each input to the same two phase mixers. Each phase mixer outputs a signal having a phase between the phases of the two delayed reference signals. Control signals are used to generate the phase of each output signal. The control signals include data indicative of one of a number of possible intermediate phases, equally-spaced apart, that can be generated by each phase mixer. For example, two signals having a respective phase of 45° and 90° can be input to a phase mixer, which can then output a signal having a phase between 45° and 90°. A control signal can include data that directs a phase mixer to generate one of eight possible intermediate phases (e.g., 50°, 55°, 60°, 65°, 70°, 75°, 80°, and 85°). Different control signals are used to control each phase mixer. In one embodiment, the control signals for each phase mixer are related such that the signals generated by each phase mixer have adjacent phases (e.g., 55° and 60°).

The output of each phase mixer is input to a third phase mixer that outputs a signal having a phase between the phases of the signals generated by the first two phase mixers. A control signal is used to generate the phase of the output signal.

In one embodiment, three stages of delay adjustment are provided to generate the clock signal. In a first stage, a variable delay line delays the reference signal by two phases having a predetermined phase difference. In a second stage, two phase mixers are used to phase mix the two delayed reference signals to produce two signals having phases between the phases of the two delayed reference signals. In a third stage, one phase mixer is used to phase mix the two signals generated by the two phase mixers in the second stage to produce an output signal having a phase between the phases of the two signals.

In another embodiment, additional stages of delay adjustment are provided to generate the clock signal. In this embodiment, phase mixers are cascaded such that the signals generated from the phase mixers in an immediately preceding stage are input to phase mixers in a next stage. With each subsequent stage of phase mixers, the phase mixers are phase mixing signals having an increasingly smaller phase difference, thus generating an output signal having finer delay adjustments.

The use of hierarchical delay adjustment advantageously allows the delay-locked loop circuit to produce a clock signal that can have fine tuning adjustments.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
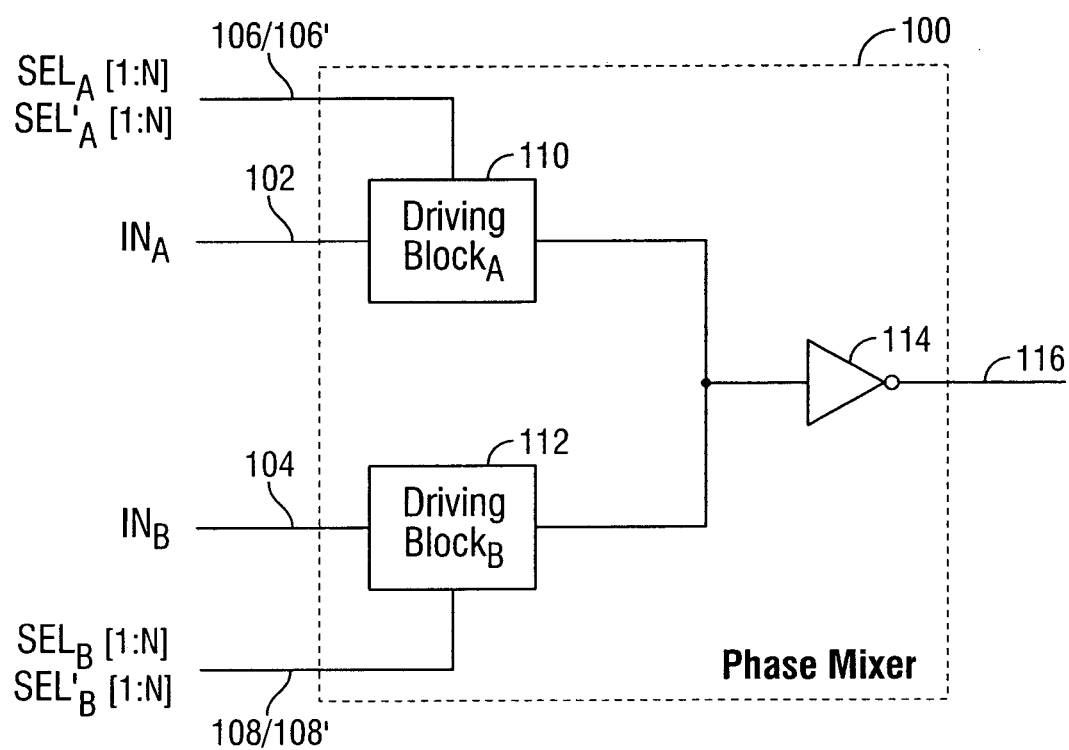
FIG. 1 is a block diagram of a phase mixer in accordance with the invention.

The invention provides a digital delay-locked loop circuit with hierarchical delay adjustment. FIG. 1 is a block diagram of one embodiment of a digital phase mixer in accordance with the invention. Phase mixer 100 receives two input signals 102 and 104 and two select signals 106 and 108, and outputs a signal 116 having a phase between the phases of input signals 102 and 104. Input signals 102 and 104 can be clock signals, data signals, control signals, or other types of signals. Input signals 102 and 104 can have phases (e.g., 0°, 10°, 36°, 45°, 90°) that are any suitable degrees apart. (Although the invention is described herein primarily in the context of phase (e.g., with units of degrees or radians), the invention may also be described in the context of time (e.g., input signals 102 and 104 can be 100 picoseconds apart)). For more optimal performance, the maximum phase difference between input signals 102 and 104 is preferably less than about two to three times the total propagation delay time of phase mixer 100. The complement of select signals 106 and 108 (i.e., signals 106' and 08') can also be input to phase mixer 100. Alternatively, phase mixer 100 can include circuitry (e.g., inverters) that generates the complement of select signals 106 and 108.

Select signals 106 and 108 can each include N select bits that can be used to determine the phase of output signal 116 relative to the phases of input signals 102 and 104. N can be any reasonable number (e.g., 5, 10). The larger the value of N, the greater the number of possible intermediate phases that can be generated. However, having too large a value for N increases the amount of circuitry required for phase mixer 100 which can also increase the characteristic load of the circuitry, causing an undesirable change in the frequency of the output.

The select bits in select signals 106 and 108 can be directly related to each other. For example, if p out of N select bits are enabled in select signal 106 for input signal 102, then (N-p) select bits are enabled in select signal 108 for input signal 104. The greater the number of select bits enabled for input signal 102, the closer in phase output signal 116 is to input signal 102. The greater the number of select bits enabled for input signal 104, the closer in phase output signal 116 is to input signal 104. If the number of select bits enabled for input signals 102 and 104 are the same, the phase of output signal 116 will be substantially halfway between the phases of input signals 102 and 104. Although select signals 106 and 108 are described herein primarily in the context of separate signals 106 and 108 for clarity, one select signal can be input to phase mixer 100, which can then include circuitry (e.g., inverters) to generate the other select signal.

The phase relationship between input signals 102 and 104 and output signal 116 can be represented by the following equation:

$$\phi(OUT)=\phi(IN_A)*(p/N)+\phi(IN_B)*(N-p)/N+\phi(T_{PM})=\phi(IN_A)*K+\phi(IN_B)*(1-K)+\phi(T_{PM}) \quad (1)$$

$\phi$=Phase
$IN_A$=First input signal 102
$IN_B$=Second input signal 104
OUT=Output signal 116
N=Number of select bits in select signals 106/108
p=Number of select bits enabled for the first input signal 102
K=p/N=Weighting factor for signal $IN_A$
1-K=Weighting factor for signal $IN_B$
$T_{PM}$=Propagation delay time The phase of output signal 116 is the sum of three components. The first component is the phase of the first input signal 102 times its weighting factor (K). The weighting factor of input signal 102 is the number of select bits in select signal 106 that is enabled (p) divided by the total number of select bits (N). The second component is the phase of the second input signal 104 times its weighting factor (1-K). The weighting factor of input signal 104 is the number of select bits in select signal 108 that is enabled (N-p) divided by the total number of select bits (N). The third component is the phase of the total propagation delay ($T_{PM}$), which is determined by multiplying the total propagation delay by 360° (or $2\pi^R$) and dividing the result by the period of input signals 102 and 104. Although not shown, secondary factors may also affect the phase of output signal 116 including, for example, the sizing of the transistors used to implement phase mixer 100.

Phase mixer 100 includes two driving blocks 110 and 112 and an inverter 114. Input signal 102 and select signal 106 are input to driving block 110. Driving block 110 uses select signal 106 to produce an output with a phase that is proportional to the relative weight of input signal 102 to output signal 116. Input signal 104 and select signal 108 are input to a second driving block 112. Driving block 112 uses select signal 108 to produce an output with a phase that is proportional to the relative weight of input signal 104 to output signal 116. The outputs of driving blocks 110 and 112 are coupled such that the phases of the generated outputs are summed together and input to inverter 114. Inverter 114 inverts the logic state of its input signal (i.e., from binary "1" to binary "0" or from binary "0" to binary "1") to produce output signal 116.

Figure 2:
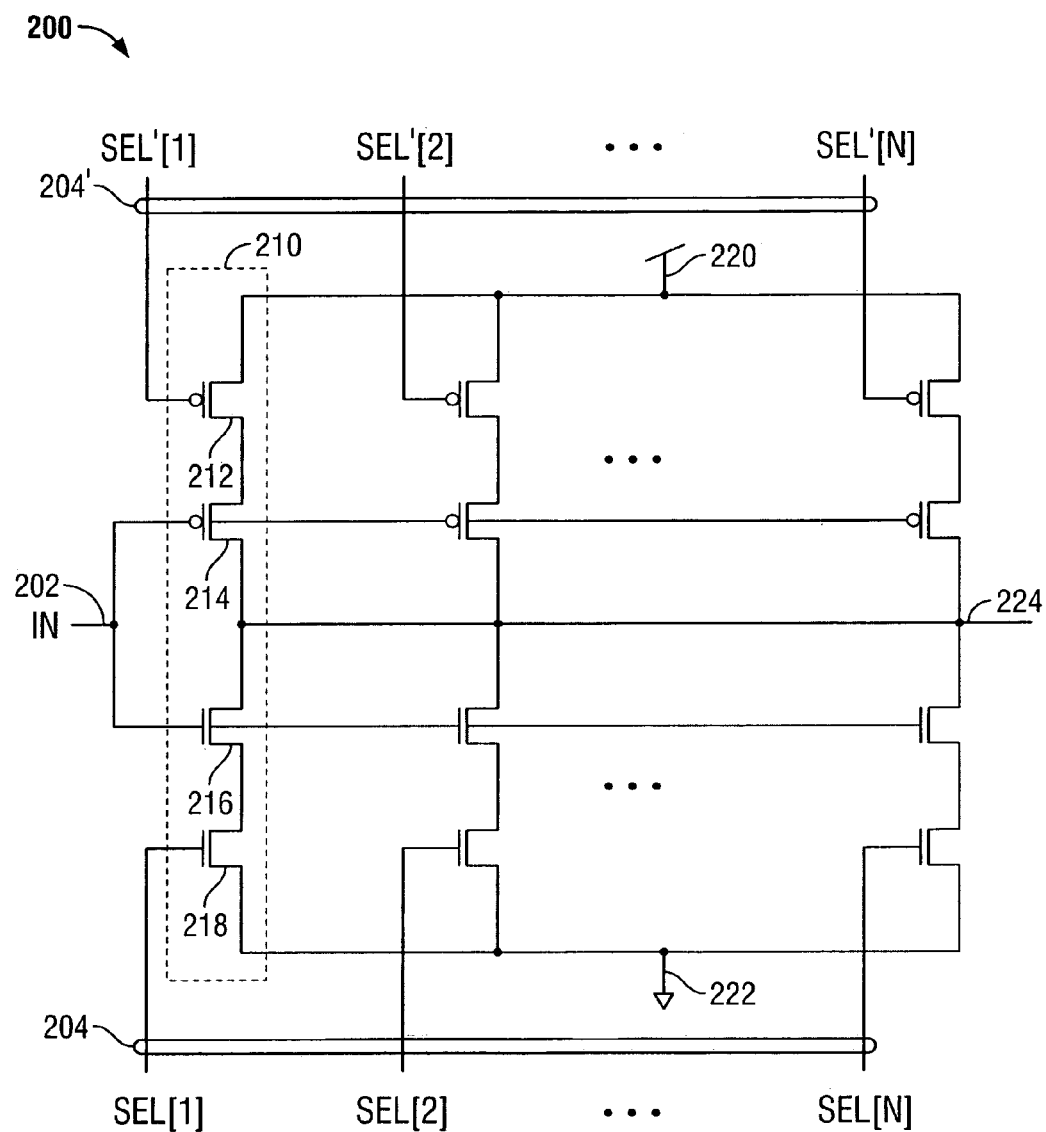
FIG. 2 is a circuit diagram illustrating a portion of the phase mixer of FIG. 1 in accordance with the invention.

Each of driving blocks 110 and 112 can include the circuitry shown in FIG. 2. Driving block 200 receives an input signal 202 (e.g., signal 102 or 104), a select signal 204, and complement select signal 204' (e.g., signals 106/106' or 108/108'). Select signal 204 and its complement signal 204' can each have N select bits. Driving block 200 includes a driving unit 210. The number of driving units 210 can be the number of bits (e.g., N) in select signal 204 or other number. Each driving unit 210 includes two p-channel metal-oxide semiconductor (PMOS) transistors 212 and 214 and two n-channel metal-oxide semiconductor (NMOS) transistors 216 and 218 connected in series between a power voltage 220 and a ground voltage 222. The gate of PMOS transistor 212 is coupled to receive one of the bits of complement signal 204' while the source is connected to power voltage 220. The gate of NMOS transistor 218 is coupled to receive a corresponding bit of select signal 204 while the source is connected to ground voltage 222. The gates of PMOS transistor 214 and NMOS transistor 216 in each driving unit 210 are coupled to an input node 202 while the drains are tied to an output node 224. (A signal received at node 202 will hereinafter be referred to as signal 202 while a signal output from node 224 will hereinafter be referred to as signal 224.)

Although the phase mixer is described herein primarily in the context of PMOS and NMOS transistors, any suitable gate or combination of gates may be used to implement a phase mixer in accordance with the invention. FIGS. 1 and 2 are merely illustrative of one embodiment of a phase mixer. In another embodiment, for example, the phase mixer can be implemented as a differential digital phase mixer.

Figure 3:
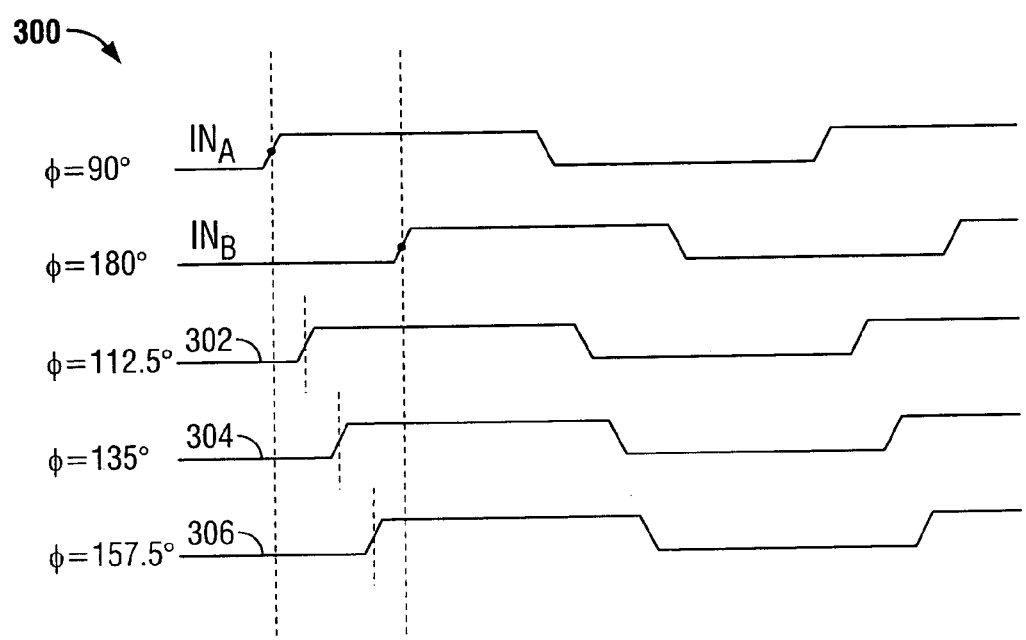
FIG. 3 is a timing diagram of input and output signals of a phase mixer in accordance with the invention.

FIG. 3 shows a timing diagram 300 illustrating the operation of an ideal phase mixer that has zero propagation delay. For example, suppose a first input signal $IN_A$ (e.g., signal 102) has a phase of 90° and a second input signal $IN_B$ (e.g., signal 104) has a phase of 180° such that the phase difference between the two input signals is 90°. Suppose also that two select signals (e.g., signals 106/108) each have four select bits (e.g., N=4). With four select bits, a phase mixer (e.g., phase mixer 100) can generate an output signal that has the same phase as either one of the input signals or one of three intermediate phases (e.g., 112.5°, 135°, or 157.5°) If four select bits (e.g., p=4) are enabled for the first input signal $IN_A$, the phase mixer can output the first input signal $IN_A$. If three select bits (e.g., p=3) are enabled for the first input signal $IN_A$ and one select bit is enabled for the second input signal $IN_B$, the phase mixer can output a signal 302 having a phase (e.g., 112.5°) between the phases of the two input signals, but closer to the phase of the first input signal $IN_A$. If two select bits (e.g., p=2) are enabled for the first input signal $IN_A$ and two select bits are enabled for the second input signal $IN_B$, the phase mixer can output a signal 304 having a phase (e.g., 135°) halfway between the phases of the two input signals. If one select bit (e.g., p=1) is enabled for the first input signal $IN_A$ and three select bits are enabled for the second input signal $IN_B$, the phase mixer can output a signal 306 having a phase (e.g., 157.5°) between the phases of the two input signals, but closer to the phase of the second input signal $IN_B$. If four select bits are enabled for the second input signal $IN_B$, the phase mixer can output the second input signal $IN_B$.

Although FIG. 3 is described herein primarily in the context of a phase mixer with two input signals 90° apart in phase and with select signals having four select bits (for clarity), the two input signals to the phase mixer can be of other degrees apart in phase and have other numbers of select bits.

There is a limit to the number of possible intermediate phases that a single phase mixer can generate. The larger the phase difference between the two inputs to the phase mixer, the larger the minimum delay adjustment. To increase the number of possible intermediate phases that can be generated, thus reducing the minimum delay adjustment, more than one phase mixer is provided. For example, two stages of phase mixers can be cascaded. In a first stage, two phase mixers each receive the same two input signals. The first phase mixer generates a signal having a first phase between the phases of the two input signals, and the second phase mixer generates a signal having a second phase between the phases of the two input signals. In a second stage, a third phase mixer receives the outputs of the two first-stage phase mixers and generates an output signal having a third phase between the first and second phases. To further reduce the minimum delay adjustment, additional stages of phase mixers can be cascaded. Each stage, except for the last stage, includes two phase mixers that each receives signals generated from phase mixers in an immediately preceding stage. At the last stage, one phase mixer is used to generate the output signal. With each stage of phase mixers, output signals having smaller delay adjustments are generated.

Figure 4:
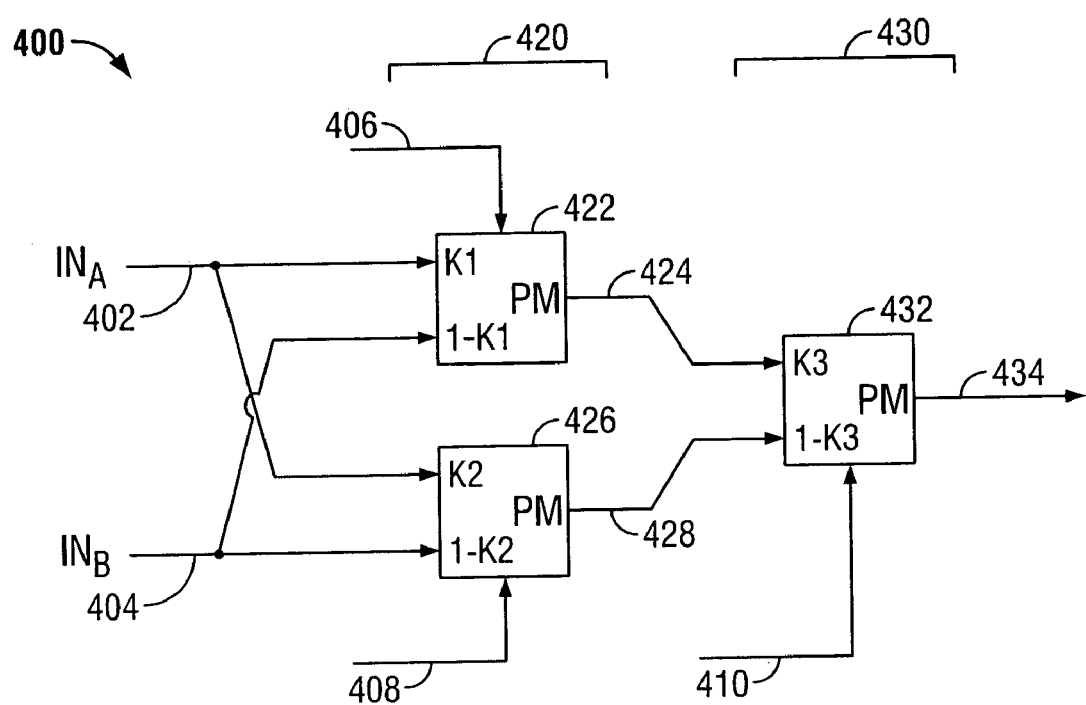
FIG. 4 is a block diagram of a phase mixer block in accordance with the invention.

FIG. 4 illustrates a phase mixer block 400 having two stages of phase mixers. A first stage 420 includes two phase mixers 422 and 426. Phase mixer 422 receives a first input signal 402, a second input signal 404, and a first control signal 406. Phase mixer 426 receives first input signal 402, second input signal 404, and a second control signal 408. Phase mixers 422 and 426 generate respective signals 424 and 428 having phases between the phases of input signals 402 and 404. The delay adjustment for the first stage is the phase difference between the two input signals (e.g., $\phi(IN_A)-\phi(IN_B)$) divided by the number of possible intermediate phases that can be generated (e.g., $N_1$):

$$\frac{\phi(IN_A) - \phi(IN_B)}{N_1} \qquad (2)$$

A second stage 430 includes one phase mixer 432. Phase mixer 432 receives as input signals 424 and 428 and a third control signal 410, and outputs a signal 434 having a phase between the phases of signals 424 and 428. Control signals 406, 408, and 410 can each have control bits for determining the weighting factor of each input signal or alternatively, can have control bits for determining the weighting factor of one of the input signals (the weighting factor of the other input signal can be determined within each phase mixer). The delay adjustment is further reduced in the second stage by the number of possible intermediate phases that can be generated (e.g., $N_2$):

$$\frac{\phi(IN_A) - \phi(IN_B)}{N_1 * N_2} \qquad (3)$$

As described throughout, each control signal (e.g., signal 406, 408, or 410) can include select signals (e.g., signals 106/106' and 108/108') that determine the weighting factor (e.g., K and 1−K) for each input signal (e.g., signals. 402/404 or 424/428) to a given phase mixer (e.g., phase mixer 422, 426, or 432). The control signal for each phase mixer can be the same or different. For example, the control signals for different stages (e.g., 420 or 430) can be different (e.g., a different number of select bits (N), a different number of select bits enabled (p)). Within a given stage, the control signal for each phase mixer can have the same number of select bits (N) with the number of select bits enabled for each control signal differing by one bit so that signals with adjacent phases are generated. Alternatively, within the given stage, the control signal for each phase mixer can have a different number of select bits with any suitable number of bits enabled for each control signal.

Figure 5:
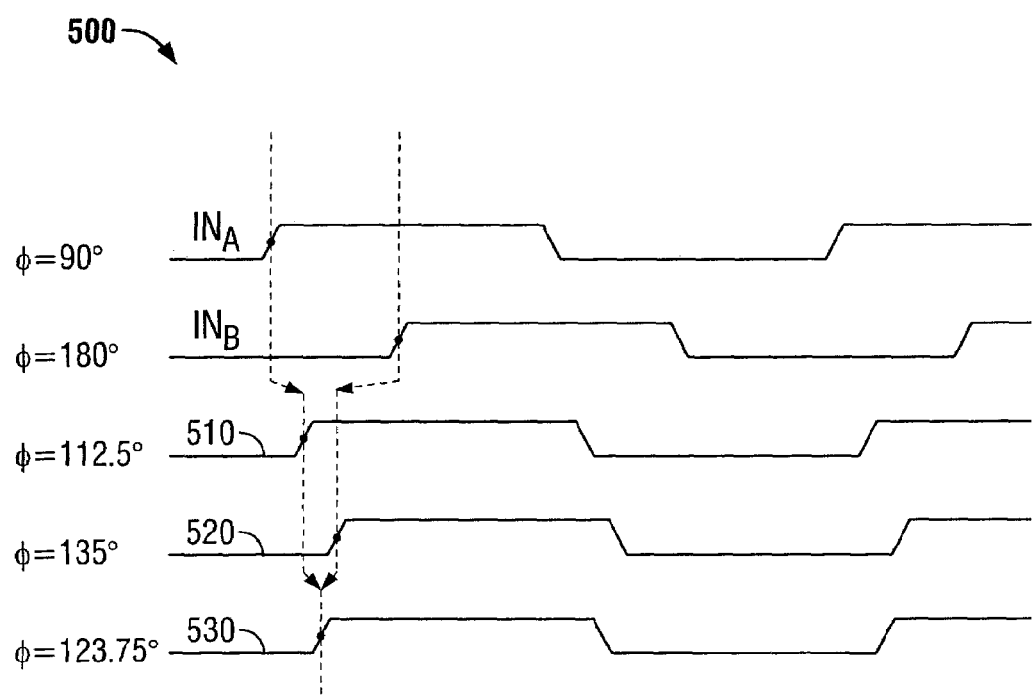
FIG. 5 is a timing diagram of input and output signals of the phase mixer block of FIG. 4 in accordance with the invention.

FIG. 5 shows a timing diagram 500 illustrating the operation of an ideal phase mixer block with zero propagation delay. For example, suppose a first input signal $IN_A$ (e.g., signal 402) has a phase of 90° and a second input signal $IN_B$ (e.g., signal 404) has a phase of 180°. The phase difference between the two input signals is 90°. Suppose also that in a first stage (e.g., stage 420) a first phase mixer (e.g., phase mixer 422) receives a control signal (e.g., signal 406) having four select bits (e.g., N=4) and a second phase mixer (e.g., phase mixer 426) receives a control signal (e.g., signal 408) also having four select bits (e.g., N=4). With four select bits, each phase mixer can generate an output signal (e.g., signal 424 or 428) that has the same phase as either one of the input signals or one of three intermediate phases (e.g., 112.5°, 135°, or 157.5°) as shown and described in connection with FIG. 3.

If the first phase mixer receives three select bits (e.g., p=3) enabled for the first input signal $IN_A$ (e.g., K1=3/4=0.75) and one select bit enabled for the second input signal $IN_B$ (e.g., 1−K1=0.25), the first phase mixer will output a signal 510 having a phase of 112.5°. If the second phase mixer receives two select bits (e.g., p=2) enabled for the first input signal $IN_A$ (e.g., K2=2/4=0.50) and two select bits enabled for the second input signal $IN_B$ (e.g., 1−K2=0.50), the second phase mixer will output a signal 520 having an adjacent phase of 135°.

Suppose also that in a second stage a third phase mixer (e.g., phase mixer 432) receives a control signal (e.g., signal 410) having four select bits (e.g., N=4). With four select bits, the phase mixer can generate an output signal (e.g., signal 434) that has the same phase as either one of the input signals or one of three intermediate phases (e.g., 118.125°, 123.75°, or 129.375°).

If the third phase mixer receives two select bits (e.g., p=2) enabled for first input signal 510 (e.g., K3=2/4=0.50) and two select bits enabled for second input signal 520 (e.g., 1−K3=0.50), the third phase mixer will output a signal 530 having a phase of 123.75°.

Figure 6:
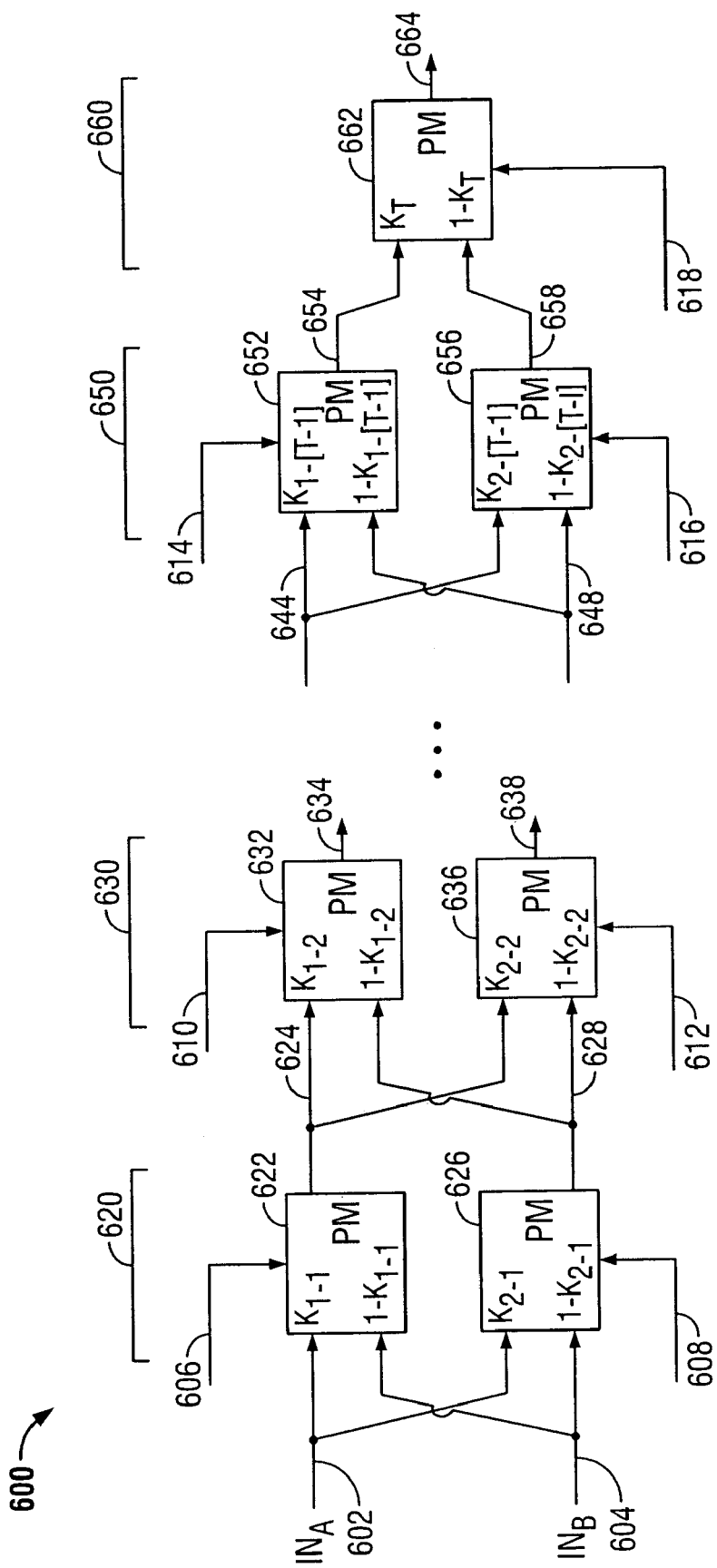
FIG. 6 is a block diagram of another embodiment of a phase mixer block in accordance with the invention.

FIG. 6 illustrates a phase mixer block 600 having multiple stages of cascaded phase mixers. Block 600 can include different numbers of stages (e.g., 2, 3, . . . , T). In a first stage 620, block 600 includes two phase mixers 622 and 626. Phase mixer 622 receives a first input signal 602, a second input signal 604, and a control signal 606. Phase mixer 626 receives first input signal 602, second input signal 604, and a control signal 608. Phase mixers 622 and 626 generate respective signals 624 and 628 having phases between the phases of input signals 602 and 604. The delay adjustment for the first stage is the phase difference between the two input signals divided by the number of possible intermediate phases that can be generated (e.g., $N_1$) as shown in expression (2).

In a second stage 630, block 600 includes two phase mixers 632 and 636. Phase mixer 632 receives signals 624 and 628 and a control signal 610. Phase mixer 636 receives signals 624 and 628 and a control signal 612. Phase mixers 632 and 636 generate respective signals 634 and 638 having phases between the phases of signals 624 and 628. The delay adjustment is further reduced in the second stage by the number of possible intermediate phases that can be generated (e.g., $N_2$) as shown in expression (3).

With each subsequent stage, the signals generated by the phase mixers have phases with increasingly smaller delay adjustments. In a second-to-last (e.g., T−1) stage 650, block 600 includes two phase mixers 652 and 656. Phase mixer 652 receives signals 644 and 648 from an immediately preceding (e.g., T−2) stage and a control signal 614. Phase mixer 656 receives signals 644 and 648 and a control signal 616. Phase mixers 652 and 656 generate respective signals 654 and 658 having phases between the phases of signals 644 and 648. The delay adjustment is further reduced in the second-to-last stage by the number of possible intermediate phases that can be generated (e.g., $N_{T-1}$):

$$\frac{\phi(IN_A) - \phi(IN_B)}{N_1 * N_2 * \ldots * N_{T-1}} \quad (4)$$

In a last (T) stage 660, block 600 includes one phase mixer 662. Phase mixer 662 receives signals 654 and 658 and a control signal 618. Phase mixer 662 generates an output signal 664 having a phase between the phases of signals 654 and 658. The delay adjustment is further reduced in the last stage by the number of possible intermediate phases that can be generated (e.g., $N_T$):

$$\frac{\phi(IN_A) - \phi(IN_B)}{N_1 * N_2 * \ldots * N_{T-1} * N_T} \quad (5)$$

Control signals 606, 608, 610, 612, 614, 616, and 618 can each have various numbers of bits and can be designed to set each respective phase mixer with various weighting factors of its input signals. While FIGS. 4 and 6 have been described herein for clarity primarily in the context of using the control signals to set respective phase mixers such that a signal having an intermediate phase is generated, some or all of the phase mixers can be controlled to output a signal having the same phase as one of the input signals depending on the desired phase of the output signal. For example, for some applications, an input signal may need each stage of a phase mixer block in order to generate an output signal having the desired phase while in other applications, an input signal may need only some of the stages of the phase mixer block in order to generate an output signal having the desired phase. Alternatively, if not all the stages in the phase mixer block are needed to generate a desired output signal, rather than sending the signals through each stage, the output signal can be routed directly to the output from the last stage needed, thereby bypassing the remaining stages.

Figure 7:
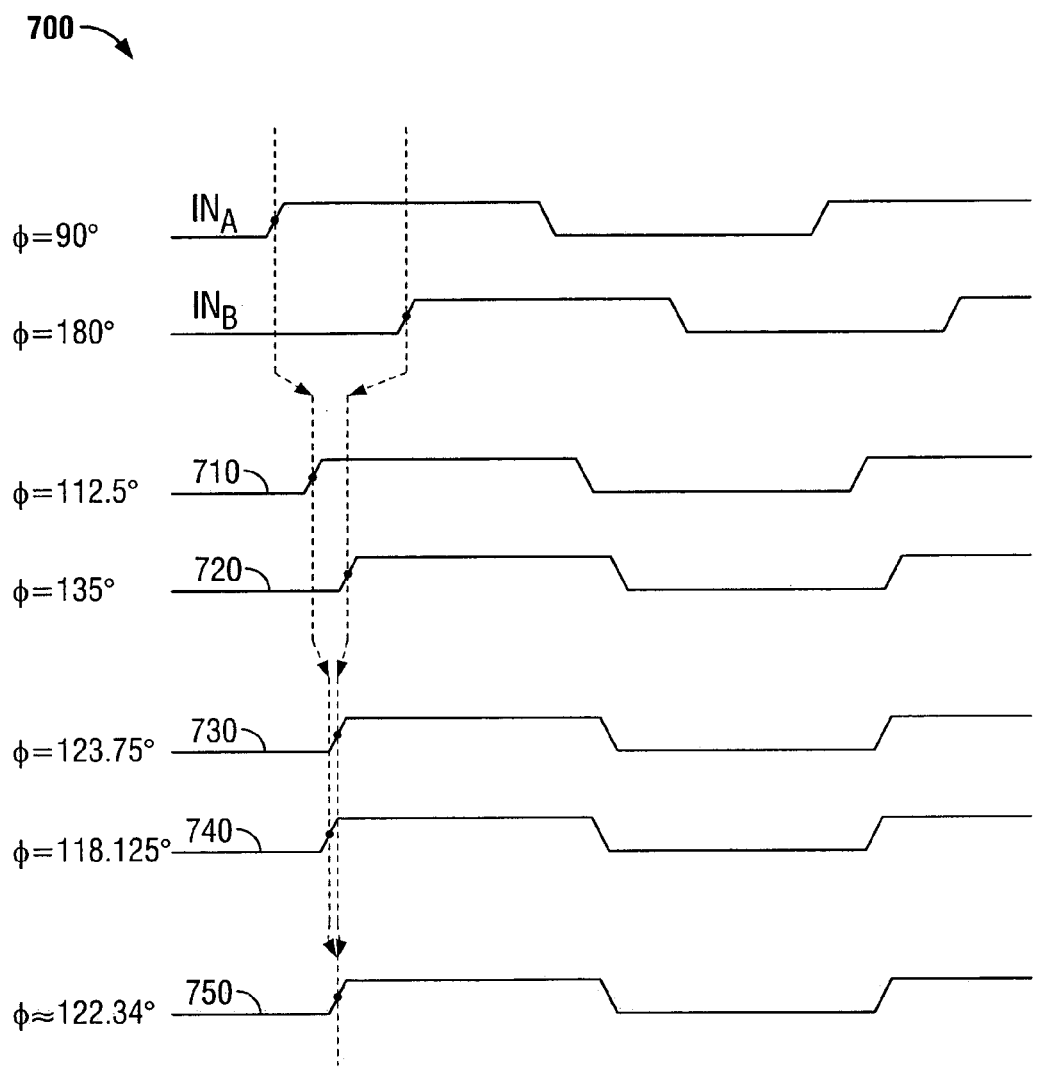
FIG. 7 is a timing diagram of input and output signals of the phase mixer block of FIG. 6 in accordance with the invention.

FIG. 7 shows a timing diagram 700 illustrating the operation of a phase mixer block having three stages of phase mixers. For example, suppose that the phase mixers in the first stage receiving input signals $IN_A$ and $IN_B$ and generating signals 710 and 720 are similar to that shown and described in connection with FIG. 5 (e.g., signals 510 and 520 correspond with signals 710 and 720, respectively).

Suppose that in a second stage (e.g., stage 650) a third phase mixer (e.g., phase mixer 652) receives a control signal (e.g., signal 614) having four select bits (e.g., N=4) and a fourth phase mixer (e.g., phase mixer 656) receives a control signal (e.g., signal 616) also having four select bits (e.g., N=4). With four select bits, each phase mixer can generate an output signal (e.g., signals 654 or 658) that has the same phase as either one of the input signals or one of three intermediate phases (e.g., 118.125°, 123.75°, or 129.375°).

If the third phase mixer receives two select bits (e.g., p=2) enabled for a first input signal 710 (e.g., $K_{1-2}$=2/4=0.50) and two select bits enabled for a second input signal 720 (e.g., $1-K_{1-2}=0.50$), the third phase mixer will output a signal 730 having a phase of 123.75°. If the fourth phase mixer receives three select bits (e.g., p=3) enabled for a first input signal 710 (e.g., $K_{2-2}=\frac{3}{4}=0.75$) and one select bit enabled for a second input signal 720 (e.g., $1-K_{2-2}0.25$), the fourth phase mixer will output a signal 740 having an adjacent phase of 118.125°.

Suppose that in a third stage (e.g., stage 660) a fifth phase mixer (e.g., phase mixer 662) receives a control signal (e.g., signal 618) having four select bits (e.g., N=4). With four select bits, each phase mixer can generate an output signal (e.g., signal 664) that has the same phase as either one of the input signals or one of three intermediate phases (e.g., approximately 119.53°, 120.94°, or 122.34°).

If the fifth phase mixer receives three select bits (e,g., p=3) enabled for a first input signal 730 (e.g., $K_3=\frac{3}{4}=0.75$) and one select bit enabled for a second input signal 740 (e.g., $1-K_3=0.25$), the fifth phase mixer will output a signal 750 having a phase of about 122.34°.

Although the examples of FIGS. 5 and 7 are described herein for clarity primarily in the context of each phase mixer having control signals with four select bits, each phase mixer can have other numbers of bits and the number of bits associated with each phase mixer can be the same, different, or any combination thereof.

Phase mixer blocks 400 or 600 can perform phase mixing for many purposes, such as, for example, generating a signal having a particular phase that is not readily available in a given circuit, for fine tuning adjustments of an input signal, and for synchronizing output data with an external clock signal. Phase mixer blocks 400 or 600 can be implemented as discrete circuitry or as part of integrated circuitry. For example, phase mixer blocks 400 or 600 can be integrated in a digital delay-locked loop circuit or a frequency multiplying digital delay-locked loop circuit.

Figure 8:
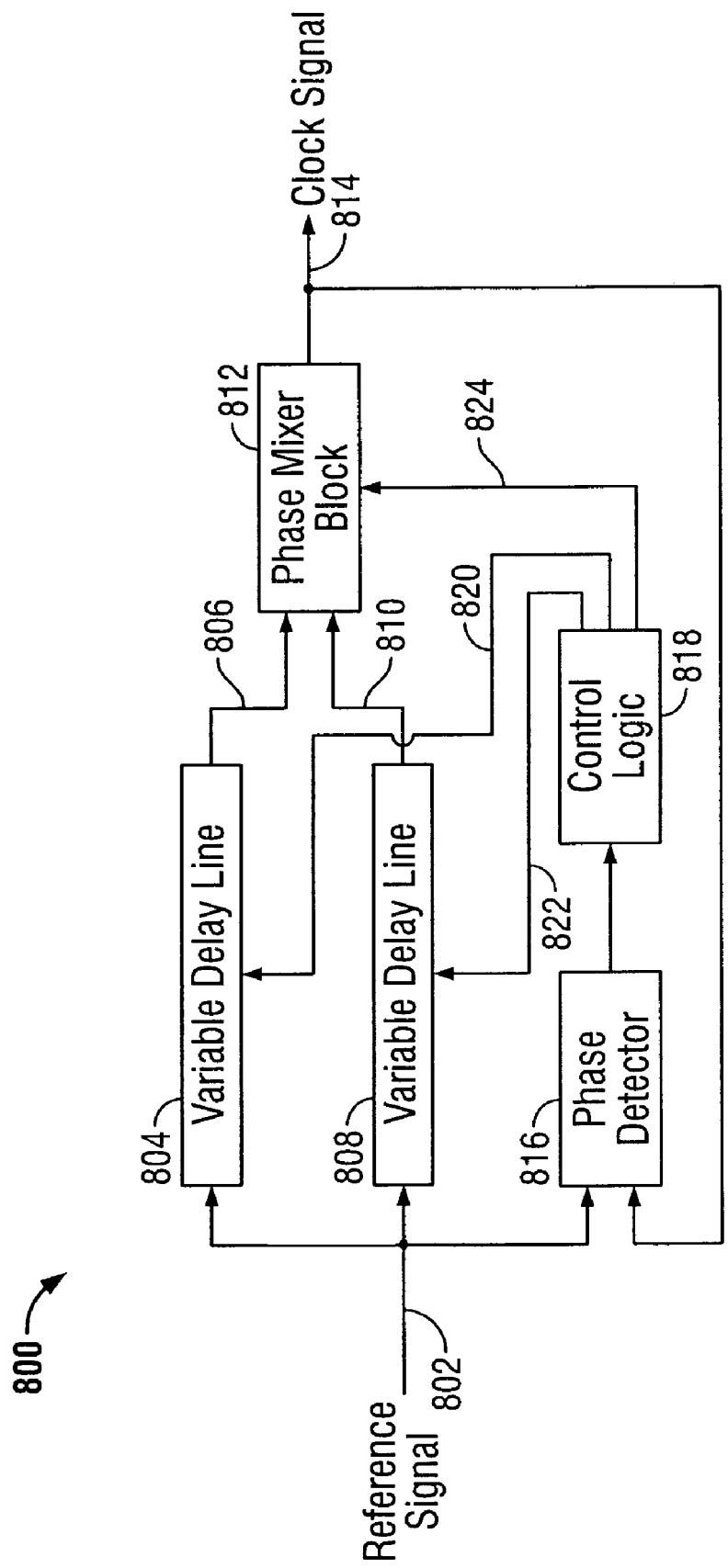
FIG. 8 is a block diagram of a digital delay locked loop circuit that includes a phase mixer block in accordance with the invention.

FIG. 8 is a block diagram a digital delay-locked loop (DLL) circuit 800 having a phase mixer block in accordance with the invention. DLL circuit 800 includes two variable delay lines 804 and 808 that each receives as input a reference signal 802 and that outputs respective signals 806 and 810 having a one unit delay (e.g., tUD) difference. Although shown as two variable delay lines 804 and 808, one variable delay line can be used to generate the two signals having a one unit delay difference. Signals 806 and 810 are input to a phase mixer block 812. Phase mixer block 812 can be blocks 400 and 600 having a suitable number of stages of cascaded phase mixers. Phase mixer block 812 produces an output clock signal 814. Reference signal 802 and clock signal 814 are input to a phase detector 816 that compares the phases of signals 802 and 814 and that outputs a signal to control logic 818 indicating whether the phase of clock signal 814 should be increased or decreased to better match the desired phase of the output signal. Based on the output of phase detector 816, control logic 818 sends a control signal 820 to variable delay line 804, a control signal 822 to variable delay line 808, and one or more control signals 824 to phase mixer block 812.

DLL circuit 800 provides multiple-hierarchical delay adjustment. Variable delay lines 804 and 808 provide a first delay adjustment of one unit delay (e.g., tUD). Phase mixer block 812 provides additional levels of delay adjustment based on the number of stages of phase mixers. If two stages of phase mixers are provided as shown in FIG. 4, a total of three levels of delay adjustment are provided. If T stages of phase mixers are provided as shown in FIG. 6, a total of (T+1) levels of delay adjustment are provided. The more stages of phase mixers, the finer the delay adjustment. The delay adjustment in DLL circuit 800 can be represented by the following:

$$\frac{tUD}{N_1 * N_2 * \ldots * N_{T-1} * N_T} \quad (6)$$

where N represents the number of possible intermediate phases that can be generated at each stage of phase mixer block 812.

Figure 9:
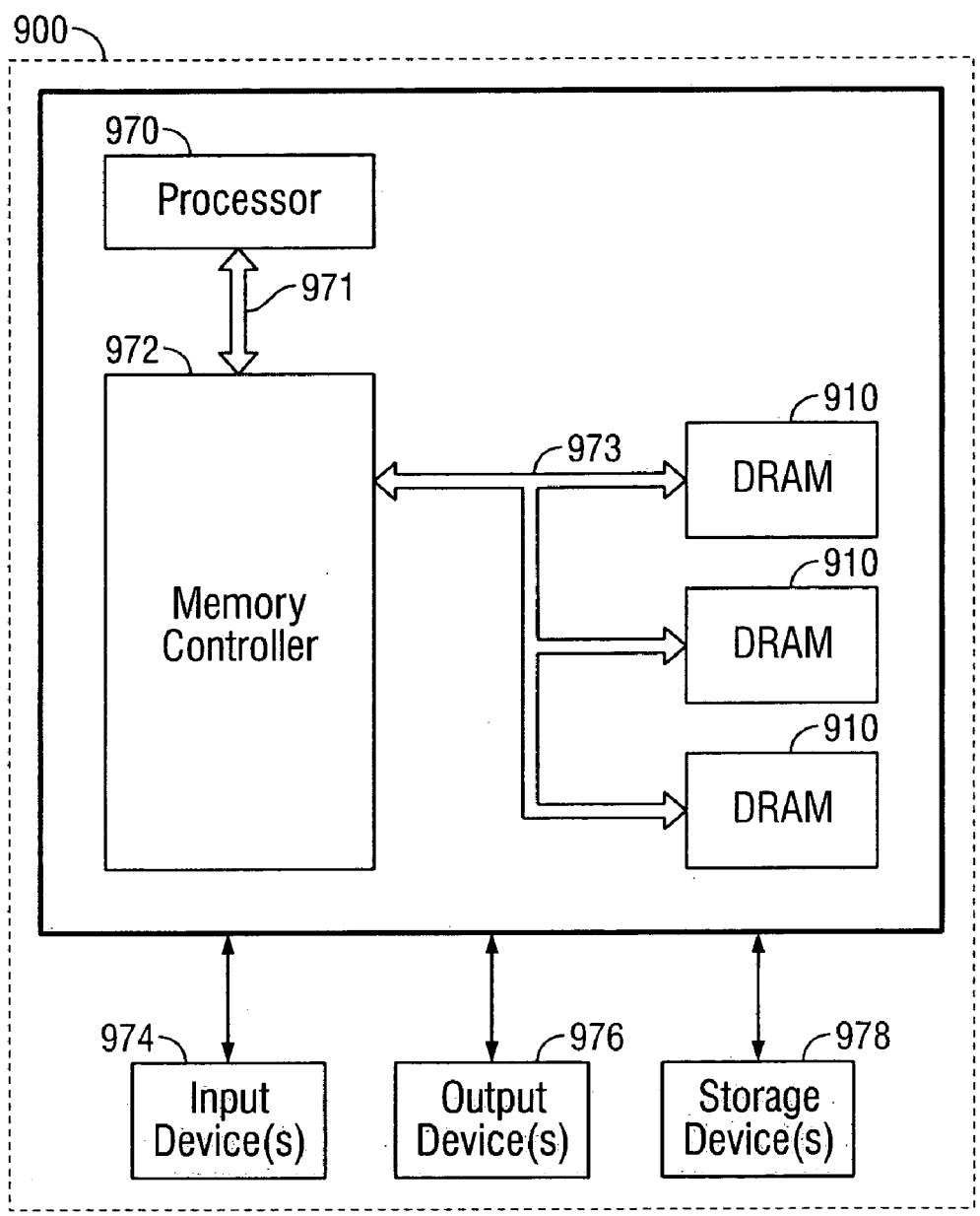
FIG. 9 is a block diagram of a system that incorporates the invention.

A digital delay-locked loop circuit is a peripheral that can be part of a semiconductor random access memory (RAM) such as dynamic RAM (DRAM) or a synchronous DRAM (SDRAM). FIG. 9 shows a system that incorporates the invention. System 900 includes a plurality of DRAM chips 910, a processor 970, a memory controller 972, input devices 974, output devices 976, and optional storage devices 978. Data and control signals are transferred between processor 970 and memory controller 972 via bus 971. Similarly, data and control signals are transferred between memory controller 972 and DRAM chips 910 via bus 973. One or more DRAM chips 910 include,a phase mixer block or digital delay-locked loop circuit having the phase mixer block in accordance with the invention. Input devices 974 can include, for example, a keyboard, a mouse, a touch-pad display screen, or any other appropriate device that allows a user to enter information into system 900. Output devices 976 can include, for example, a video display unit, a printer, or any other appropriate device capable of providing output data to a user. Note that input devices 974 and output devices 976 can alternatively be a single input/output device. Storage devices 978 can include, for example, one or more disk or tape drives.

Note that the invention is not limited to DRAM chips, but is applicable to other integrated circuit chips that implement the phase mixer block or a delay-locked loop circuit having the phase mixer block.

Thus it is seen that a digital delay-locked loop circuit with hierarchical delay adjustment is provided. One skilled in the art will appreciate that the invention can be practiced by other than the described embodiments, which are presented for purposes of illustration and not of limitation, and the present invention is limited only by the claims which follow.

I claim :

1. A method of signal delay adjustment comprising:
processing a first input signal having a first phase, a second input signal having a second phase, and a first control signal in a first digital phase mixer to generate a first output signal having a third phase between said first phase and said second phase based on said first control signal;
processing said first input signal, said second input signal, and a second control signal in a second digital phase mixer to generate a second output signal having a fourth phase between said first phase and said second phase based on said second control signal; and
processing said first output signal, said second output signal, and a third control signal in a third digital phase mixer to generate a third output signal having a fifth phase between said third phase and said fourth phase based on said third control signal.

2. The method of claim 1 wherein said first control signal comprises data indicative of a first weighting factor of said first input signal and a second weighting factor of said second input signal.

3. The method of claim 1 wherein said second control signal comprises data indicative of a first weighting factor of said first input signal and a second weighting factor of said second input signal.

4. The method of claim 1 wherein said third control signal comprises data indicative of a first weighting factor of said first output signal and a second weighting factor of said second output signal.

5. The method of claim 1 further comprising processing a reference signal and a fourth control signal in a variable digital delay line to generate said first input signal and said second input signal, wherein said first input signal and said second input signal are phase-shifted signals of said reference signal based on said fourth control signal and have a predetermined phase difference.

6. The method of claim 5 further comprising processing said reference signal and said third output signal in a phase detector to generate a signal indicative of whether said fifth phase should be increased or decreased.

7. The method of claim 6 further comprising processing said signal from said phase detector in control logic to generate said control signals.

8. The method of claim 1 further comprising:
processing a reference signal and a fourth control signal in a first variable digital delay line to generate said first input signal based on said fourth control signal; and
processing said reference signal and a fifth control signal in a second variable digital delay line to generate said second input signal based on said fifth control signal, wherein said first input signal and said second input signal are phase-shifted signals of said reference signal and have a predetermined phase difference.

9. The method of claim 8 further comprising processing said reference signal and said third output signal in a phase detector to generate a signal indicative of whether said fifth phase should be increased or decreased.

10. The method of claim 9 further comprising processing said signal from said phase detector in control logic to generate said control signals.

11. A method of signal delay adjustment comprising:
processing a first input signal having a first phase, a second input signal having a second phase, and a first control signal in a first digital phase mixer to generate a first output signal having a third phase between said first phase and said second phase based on said first control signal;
processing said first input signal, said second input signal, and a second control signal in a second digital phase mixer to generate a second output signal having a fourth phase between said first phase and said second phase based on said second control signal;
processing said first output signal, said second output signal, and a third control signal in a third digital phase mixer to generate a third output signal having a fifth phase between said third phase and said fourth phase based on said third control signal;
processing said first output signal, said second output signal, and a fourth control signal in a fourth digital phase mixer to generate a fourth output signal having a sixth phase between said third phase and said fourth phase based on said fourth control signal; and
processing said third output signal, said fourth output signal, and a fifth control signal in a fifth digital phase mixer to generate a fifth output signal having a seventh phase between said fifth phase and said sixth phase based on said fifth control signal.

12. A method of signal delay adjustment comprising:
processing a reference signal and a first control signal in a first variable digital delay line to generate a first output signal having a first phase based on said first control signal;
processing said reference signal and a second control signal in a second variable digital delay line to generate a second output signal having a second phase based on said second control signal;
processing said first output signal, said second output signal, and a third control signal in a first digital phase mixer to generate a third output signal having a third phase between said first phase and said second phase based on said third control signal;
processing said first output signal, said second output signal, and a fourth control signal in a second digital phase mixer to generate a fourth output signal having a fourth phase between said first phase and said second phase based on said fourth control signal; and
processing said third output signal, said fourth output signal, and a fifth control signal in a third digital phase mixer to generate a fifth output signal having a fifth phase between said third phase and said fourth phase based on said fifth control signal.

13. The method of claim 12 further comprising processing said reference signal and said fifth output signal in a phase detector to generate a signal indicative of whether said fifth phase should be increased or decreased.

14. The method of claim 13 further comprising processing said signal from said phase detector in control logic to generate said control signals.

15. The method of claim 12 wherein:
said first control signal comprises data indicative of said first phase by which said reference signal is to be phase-shifted to generate said first output signal; and
said second control signal comprises data indicative of said phase by which said reference signal is to be phase-shifted to generate said second output signal, wherein said first phase and said second phase have a predetermined phase difference.

16. The method of claim 12 wherein said third control signal comprises data indicative of a first weighting factor of said first output signal and a second weighting factor of said second output signal.

17. The method of claim 12 wherein said fourth control signal comprises data indicative of a first weighting factor of said first output signal and a second weighting factor of said second output signal.

18. The method of claim 12 wherein said fifth control signal comprises data indicative of a first weighting factor of said third output signal and a second weighting factor of said fourth output signal.

19. Apparatus for signal delay adjustment comprising:
means for processing a first input signal having a first phase, a second input signal having a second phase, and a first control signal in a first digital phase mixer to generate a first output signal having a third phase between said first phase and said second phase based on said first control signal;
means for processing said first input signal, said second input signal, and a second control signal in a second digital phase mixer to generate a second output signal having a fourth phase between said first phase and said second phase based on said second control signal; and
means for processing said first output signal, said second output signal, and a third control signal in a third digital phase mixer to generate a third output signal having a fifth phase between said third phase and said fourth phase based on said third control signal.

20. Apparatus for signal delay adjustment comprising:
means for processing a reference signal and a first control signal in a first variable digital delay line to generate a first output signal having a first phase based on said first control signal;
means for processing said reference signal and a second control signal in a second variable digital delay line to generate a second output signal having a second phase based on said second control signal;
means for processing said first output signal, said second output signal, and a third control signal in a first digital phase mixer to generate a third output signal having a third phase between said first phase and said second phase based on said third control signal;
means for processing said first output signal, said second output signal, and a fourth control signal in a second digital phase mixer to generate a fourth output signal having a fourth phase between said first phase and said second phase based on said fourth control signal; and
means for processing said third output signal, said fourth output signal, and a fifth control signal in a third digital phase mixer to generate a fifth output signal having a fifth phase between said third phase and said fourth phase based on said fifth control signal.

* * * * *